(12) United States Patent
Mottin et al.

(10) Patent No.: US 12,324,272 B2
(45) Date of Patent: Jun. 3, 2025

(54) POSITIONING MASK, SYSTEM AND METHOD FOR MANUFACTURING AN OPTOELECTRONIC DEVICE

(71) Applicant: ALEDIA, Échirolles (FR)

(72) Inventors: Eric Mottin, St Martin le Vinoux (FR); Nohora Caicedo, Grenoble (FR); Ivan-Christophe Robin, Grenoble (FR)

(73) Assignee: ALEDIA, Echirolles (FR)

( * ) Notice: Subject to any disclaimer, the term of this patent is extended or adjusted under 35 U.S.C. 154(b) by 628 days.

(21) Appl. No.: 17/358,589

(22) Filed: Jun. 25, 2021

(65) Prior Publication Data
US 2021/0408321 A1   Dec. 30, 2021

(30) Foreign Application Priority Data

Jun. 29, 2020 (FR) ..................................... 20/06775

(51) Int. Cl.
*H10H 20/01* (2025.01)
(52) U.S. Cl.
CPC ........... *H10H 20/01* (2025.01); *H10H 20/036* (2025.01)
(58) Field of Classification Search
CPC ...................... H01L 2933/0033; H10H 20/036
USPC ........................................................ 438/28
See application file for complete search history.

(56) References Cited

U.S. PATENT DOCUMENTS

2015/0221835 A1 * 8/2015 Tischler ................. H01L 33/62
438/27
2018/0301265 A1 * 10/2018 Wu ....................... H01F 13/006

FOREIGN PATENT DOCUMENTS

| CN | 107346803 A | 11/2017 |
| CN | 110088886 A | 8/2019 |
| JP | 2006148146 A | 6/2006 |
| JP | 2009249706 A | 10/2009 |

* cited by examiner

*Primary Examiner* — Hsin Yi Hsieh
(74) *Attorney, Agent, or Firm* — CANTOR COLBURN LLP

(57) ABSTRACT

A positioning mask includes a body delimiting conduits dimensioned to each accommodate a single functional electronic object and opening through a first opening on a cooperation face, and through a second opening on a reception face. A system for manufacturing an optoelectronic device includes functional electronic objects distributed and fixed on a reception face of a screen substrate. The system further includes a positioning mask of the aforementioned type as well as a supplying unit for freely depositing an assembly of functional electronic objects on the reception face, and a placing unit for positioning the cooperation face facing the reception face, the conduits being arranged at predetermined locations on the reception face where the functional electronic objects are positioned. A method for manufacturing an optoelectronic device is also related.

18 Claims, 4 Drawing Sheets

[Fig. 1]
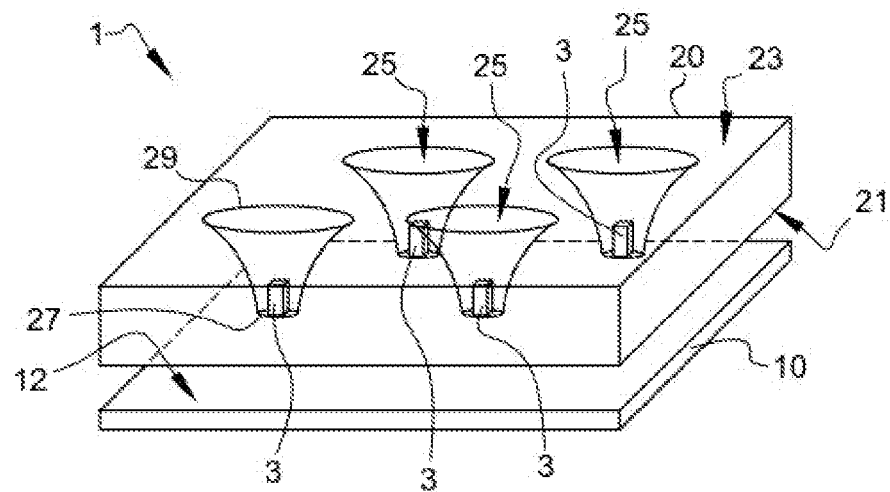
[Fig. 2]
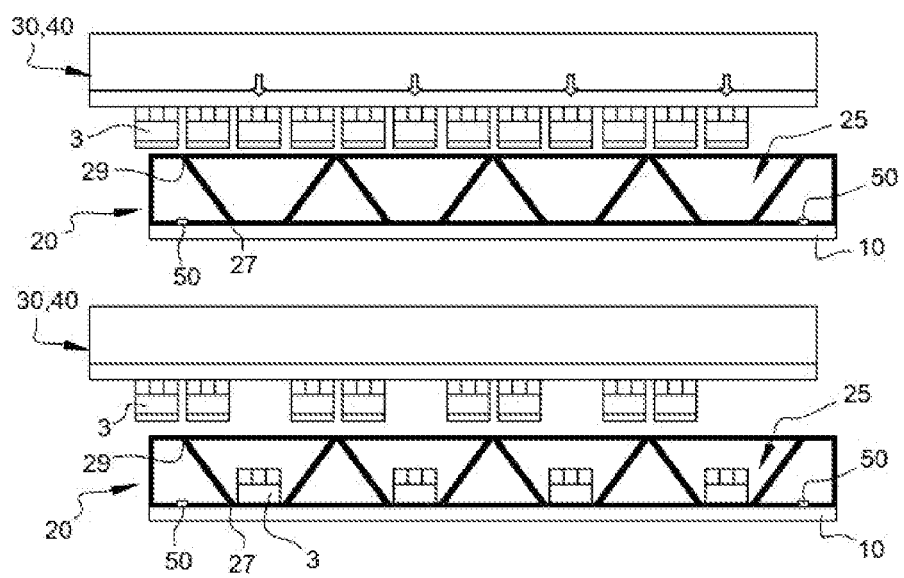

[Fig. 3]
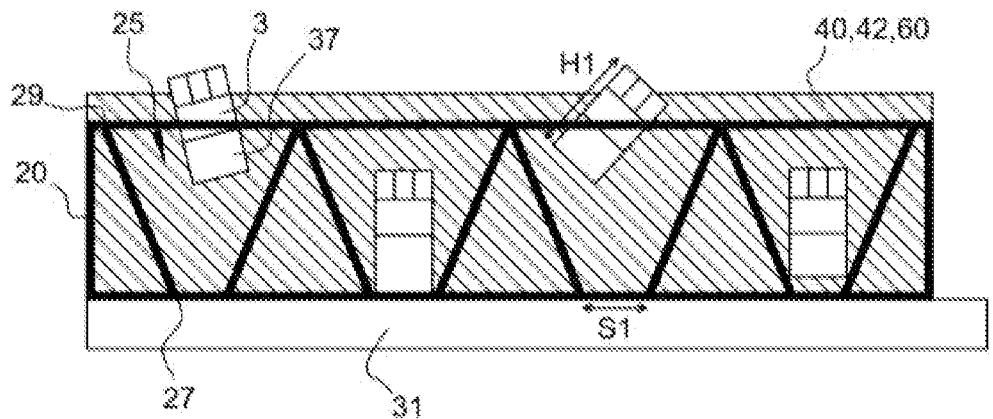
[Fig. 4]
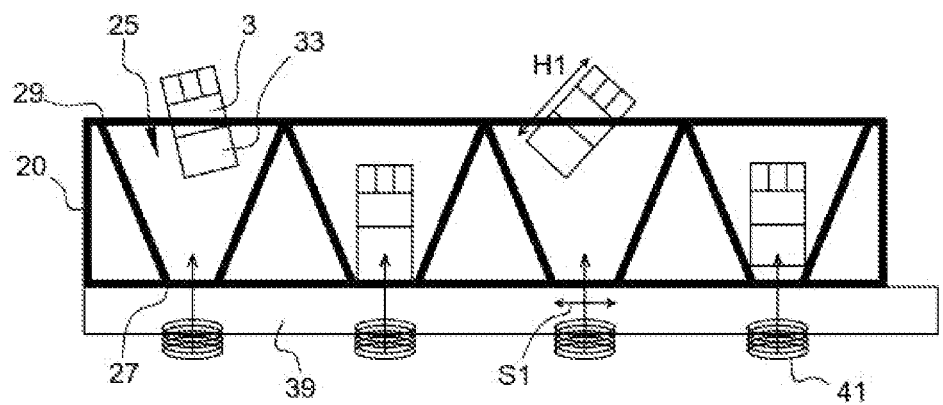

[Fig. 5]
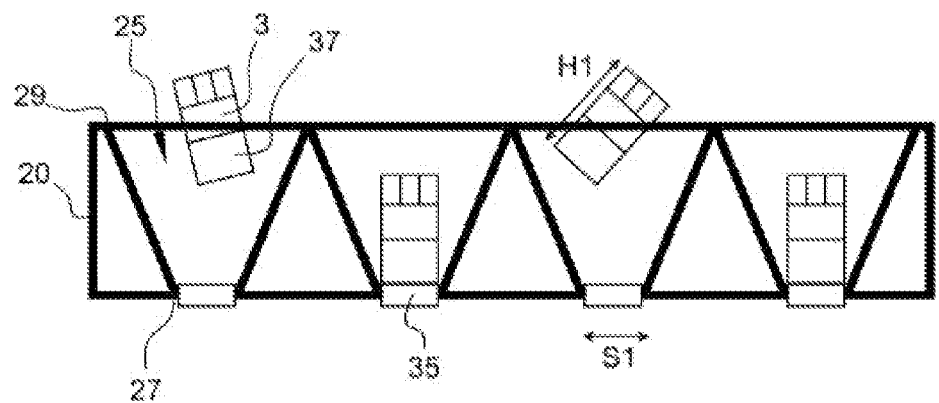
[Fig. 6]
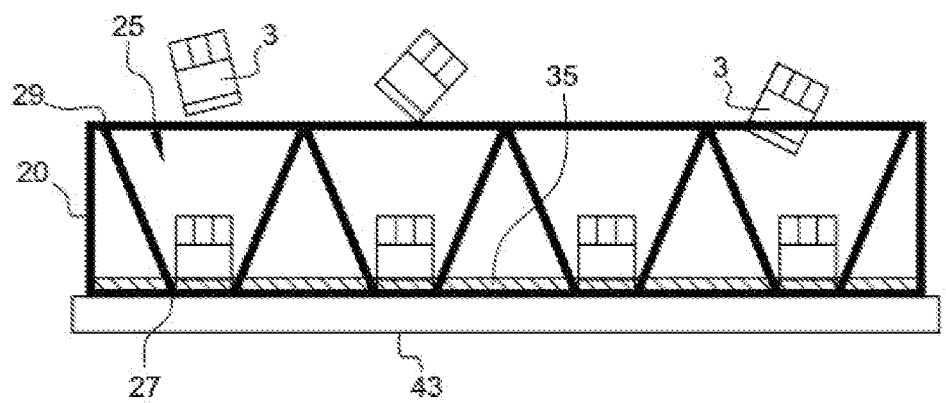

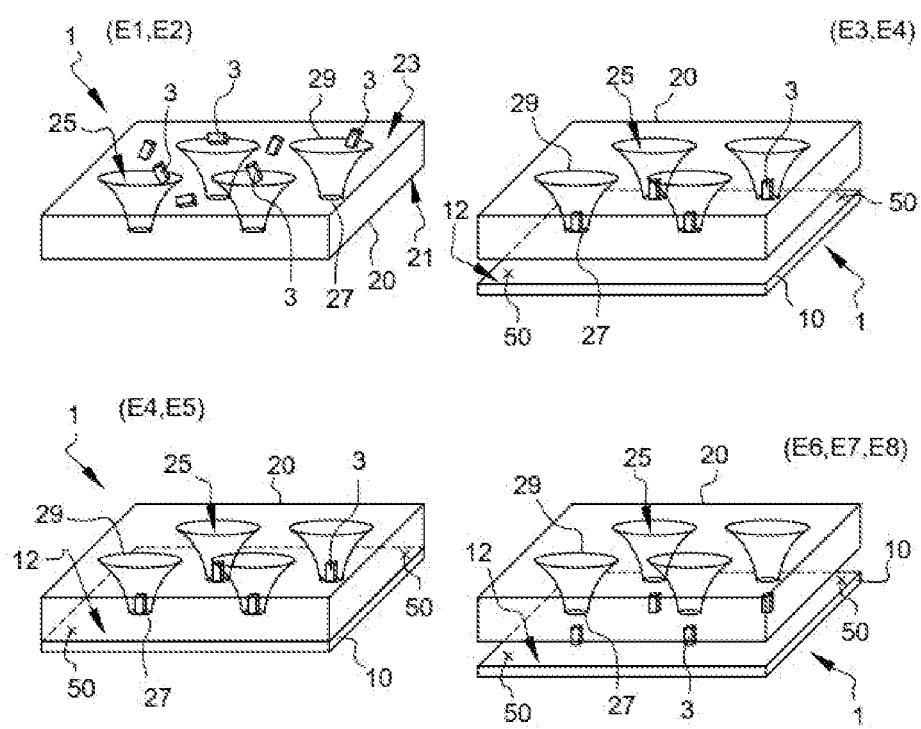
[Fig. 7]

POSITIONING MASK, SYSTEM AND METHOD FOR MANUFACTURING AN OPTOELECTRONIC DEVICE

CROSS REFERENCE TO RELATED APPLICATIONS

This application claims priority to French Patent Application No. 20/06775, filed on Jun. 29, 2020, the contents of which are hereby incorporated by reference in their entirety.

TECHNICAL FIELD

The present disclosure concerns a positioning mask and a system for manufacturing an optoelectronic device comprising a plurality of functional electronic objects fixed to a light emission screen substrate.

The disclosure also concerns a method for manufacturing such an optoelectronic device.

BACKGROUND

In the field of light display screens, the light elements constituting the screen must be arranged in a matrix way in an increasingly precise manner as the resolution of the screens increases. These light elements each comprise at least one light-emitting diode and are organized as a multicolored pixel or as a monochrome subpixel.

It is known to produce light-emitting diodes on an initial support in the form of a silicon or sapphire substrate and to transfer them, by a technique known as «flip-chip», on a reception support different from the initial support and intended to constitute, after this transfer, the light display screen.

A first drawback of this technique is that the alignment between the light elements and the reception support requires very high precision (less than 1 µm), this constraint becoming more and more difficult to comply as the resolution of the manufactured screens increases and the miniaturization of light-emitting diodes required for this level of resolution increase.

A second drawback lies in the fact that in order to produce multicolored light elements, it is necessary to practice several successive stages of transferring light elements, the light-emitting diodes capable of emitting in a given color being transferred in each of these successive steps. Yet, the thermocompression method, generally used for the «flipped chip» technique, implies that a compressive force is used at a given temperature to effect the transfer, which becomes complicated or even impossible when previously transferred light-emitting diodes are already present on the final support, at the risk of causing damage by the compression phenomenon.

A solution to this latter drawback consists in producing a final support having a reception face having a relief to allow the transfer of light-emitting diodes to different predetermined locations having different altitudes counted in the direction transverse to the general plane of the final support. But this solution remains complex to achieve and is moreover expensive.

Finally, the solutions currently implemented are difficult or even impossible to implement on the assumption of a final support having a general shape other than generally flat.

SUMMARY

The present disclosure proposes a solution which answers all or part of the aforementioned problems.

This can be achieved by providing a positioning mask comprising a body delimiting a cooperation face intended to face a reception face of a light emission screen substrate, and an opposite reception face of the cooperation face, the body delimiting a plurality of conduits distributed over the surface of the body where each conduit is dimensioned to accommodate a single semiconductor functional electronic object intended to be positioned and fixed on the reception face and is traversing through the material constituting the body and opens out on the side of the cooperation face through a first opening and opens out on the reception face side through a second opening, the section of the first opening being strictly smaller than the section of the second opening.

The arrangements described above make it possible to provide a positioning mask configured to facilitate the precise positioning of functional electronic objects without requiring precise positioning at the reception face.

Some preferred, but non-limiting, aspects of this system are as follows.

According to an embodiment, the body is made of a polymer material. Thus, the body of the positioning mask can be produced by methods suitable for polymer materials.

According to an embodiment, the positioning mask is obtained by a plastic embossing method.

According to an embodiment, the positioning mask is obtained by a 3D printing method.

The arrangements described above make it possible to provide a method for producing the positioning mask that can be adapted to an industrial scale, while having a low cost.

According to an embodiment, the dimensions of a section of the first opening are comprised between 1.1 µm and 1.1 mm.

According to an embodiment, the distance between two first openings is comprised between 1 µm and 2 mm.

According to an embodiment, the body is made of a metallic material.

According to an embodiment, the conduit has a frustoconical shape, the first opening and the second opening constituting the end bases of the truncated cone. For example, the diameter of the second opening may be less than or substantially equal to the distance separating two functional electronic objects when they are positioned on the screen substrate.

According to another embodiment, the conduit is infundibuliform. In this way, the positioning mask with one or more funnel-shaped conduits allows faster positioning, and therefore release, of the functional electronic objects facing the funnels. These arrangements therefore make it possible to obtain precise positioning at the level of the reception face of the screen substrate, and thus reduce the need for matching between the mesh of the screen substrate and the mesh of the supplying unit, or damping any dimensional clearances.

According to a non-limiting variant, the body has a substantially parallelepipedal shape, the reception surface and the cooperation surface forming two parallel faces of the body.

Advantageously, the body may have a rectangular parallelepiped shape in order to be able to be adapted to the rectangular shape of a screen or part of a screen.

Alternatively, the body may have a cylindrical shape to be able to be adapted to the shape of a build plate generally used in microelectronic methods.

The disclosure also relates to a system for manufacturing an optoelectronic device comprising a plurality of unitary semiconductor functional electronic objects fixed to a reception face of a light emission screen substrate while being distributed over all or part of the free surface of the reception face, the system comprising:
- a positioning a mask of the type of those described above,
- a supplying unit for freely depositing an assembly of functional electronic objects on the reception face of the positioning mask,
- a placing unit for positioning the cooperation face of the positioning mask facing the reception face of the screen substrate, in a relative position such that the functional electronic objects positioned in the conduits delimited by the body of the positioning mask are in contact with the reception face of the screen substrate, the conduits delimited by the body of the positioning mask being arranged at predetermined locations corresponding to the locations of the reception face of the screen substrate where the functional electronic objects of the optoelectronic device are positioned.

The term «freely» means that the assembly of functional electronic objects placed on the reception face of the positioning mask are not fixed to another element.

The arrangements described above make it possible to provide a manufacturing system allowing the precise positioning of functional electronic objects on the surface of a screen substrate in a simple and inexpensive manner. Moreover, following the realization of the optoelectronic device, it is possible to reuse the positioning mask, which makes it possible to contain the costs.

Advantageously, the fact of freely depositing the functional electronic objects on the reception face of the positioning mask makes it possible to distribute the functional electronic objects on a reception face of a screen substrate without first constraining their positioning vis-à-vis the orifices made in the positioning mask.

Some preferred, but non-limiting, aspects of this system are as follows.

According to an embodiment, the functional electronic objects have a disorderly free organization.

According to an embodiment, the system for manufacturing an optoelectronic device comprises a distribution unit making it possible to position a functional electronic object among the assembly of functional electronic objects in each of the conduits delimited by the body of the positioning mask.

According to an embodiment, the supplying unit comprises handling equipment or a handling substrate intended to be disposed above the reception surface.

According to this embodiment, one or more of the functional electronic objects can be separated from said handling substrate or from said handling equipment when they are facing a conduit. In this case, the supplying unit acts as a distribution unit.

For example, the handling equipment may comprise a handle to which functional electronic objects are attached. Thus, when said handle is disposed above the positioning mask, it is possible to separate one or more of the functional electronic objects disposed facing a conduit, for example by means of a laser pulse.

The arrangements described above make it possible to separate only certain functional electronic objects from the supplying unit in the conduits of the positioning mask.

According to an embodiment, the distribution unit can comprise an agitation fluid configured to define an agitation environment, said agitation environment being configured to promote the positioning of a functional electronic object in at least one of the conduits delimited by the body of the positioning mask.

According to an embodiment, the distribution unit may comprise a vibration device configured to vibrate the body of the positioning mask.

According to an embodiment, the distribution unit may comprise a unit for applying a liquid intended to contain a functional electronic object, said liquid being in contact with an ultrasonic vibration device, in this case, the vibration of the liquid by the ultrasonic vibration device can make it possible to position a functional electronic object in at least one of the conduits delimited by the body of the positioning mask.

According to an embodiment, the distribution unit may comprise a unit for applying a flow fluid configured to generate a flow capable of positioning a functional electronic object in at least one of the conduits delimited by the body of the positioning mask.

According to an embodiment, the distribution unit may comprise a unit for applying a magnetic field, such as for example a device for generating a magnetic field provided with coils. In this case, a functional electronic object of the assembly may comprise a magnetically sensitive portion configured to allow the positioning of the functional electronic object when the magnetically sensitive portion is subjected to the magnetic field.

According to an embodiment, the distribution unit may comprise a unit for applying an electric field. In this case, a functional electronic object of the assembly may comprise an electrically sensitive portion configured to allow the positioning of the functional electronic object when the electrically sensitive portion is subjected to the electric field.

According to an embodiment, the functional electronic object comprises a light-emitting element comprising at least one light-emitting diode capable of emitting and/or picking up light, and optionally an electronic control component associated with said at least one light-emitting diode, for example a transistor.

According to an embodiment, the placing unit comprises alignment elements configured to allow alignment of the body facing the reception face of the screen substrate.

According to an embodiment, each functional electronic object has a height considered in a transverse direction oriented transversely to the reception face of a light emission screen substrate, said height being greater than the dimensions of said functional electronic object in a plane perpendicular to the transverse direction and in which the dimensions of the section of the first opening of the conduits are less than the value of said height.

The arrangements described above make it possible to prevent the passage of the functional electronic object through the first opening in a configuration where its height would be across the first opening.

According to an embodiment, the body comprises a holding agent disposed at the first opening, said holding agent being configured to hold the functional electronic object in a first configuration in which the functional electronic object is secured to the body of the positioning mask at the level of the cooperation surface.

In an embodiment, the holding agent is configured to be in a solid state at a target temperature, and in which the temperature of the body of the positioning mask at the first opening is lower than the target temperature when the functional electronic object is in the first configuration.

According to an embodiment, the system for manufacturing an optoelectronic device may comprise a cooling plate, configured to lower the temperature to the level of the target temperature.

According to an embodiment, the holding agent comprises water, and the target temperature corresponds to the solidification temperature of the water, for example 0° C.

According to an embodiment, the holding agent comprises a soldering agent disposed so as to temporarily close the first opening 27 of the conduit at the level of the cooperation surface.

For example, the soldering agent can comprise silver tin or indium.

According to an embodiment, each functional electronic object comprises a proximal end intended to be turned towards the side of the reception face of the screen substrate and an opposite distal end and in which the system comprises a unit for orienting the functional electronic objects relative to the body of the positioning mask in such a way that any functional electronic object emerging from the body through the first opening is oriented so that its proximal end is facing the reception face of the screen substrate.

According to an embodiment, the orientation unit comprises a unit for applying a fluid in which the functional electronic objects are oriented by preferential gravity. In this case, each functional electronic object can be provided with a dense portion having a sufficient density to make it preferentially sensitive to gravity.

According to an embodiment, the orientation unit may comprise a unit for applying a magnetic field. In this case, each functional electronic object may comprise a magnetically sensitive portion configured to allow the orientation of the functional electronic object when the magnetically sensitive portion is subjected to the magnetic field.

The disclosure also relates to a method for manufacturing an optoelectronic device comprising a phase of fixing a plurality of unitary semiconductor functional electronic objects on a reception face of a light emission screen substrate of the optoelectronic device, at the end of which the functional electronic objects are distributed over all or part of the free surface of the reception face, the fixing phase comprising:
- a step of providing a positioning mask comprising a body delimiting a cooperation face intended to face the reception face of the screen substrate, and a reception face opposite to the cooperation face, the body delimiting a plurality of conduits distributed over the surface of the body where each conduit is dimensioned to accommodate a single functional electronic object and passes through the material constituting the body and opens out on the side of the cooperation face through a first opening and opens out on the side of the reception face by a second opening, the section of the first opening being strictly smaller than the section of the second opening,
- a supplying step to freely deposit an assembly of functional electronic objects on the reception face of the positioning mask,
- an placing step in which the cooperation face of the positioning mask is positioned facing the reception face of the screen substrate, in a relative position such that the functional electronic objects positioned in the conduits delimited by the body of the positioning mask are in contact with the reception face of the screen substrate, the conduits delimited by the body of the positioning mask being arranged at predetermined locations corresponding to the locations of the reception face of the screen substrate where the functional electronic objects of the optoelectronic device are positioned.

The arrangements described above make it possible to provide a method for precisely positioning functional electronic objects on the surface of a screen substrate by a simple and inexpensive method. Indeed, such simplicity is notably enabled by the fact of freely depositing the functional electronic objects on the reception face of the positioning mask. Thus, the distribution of functional electronic objects on a reception face of a screen substrate can be implemented without first constraining their positioning vis-à-vis the orifices formed in the positioning mask.

Furthermore, the positioning mask constitutes a part capable of holding the functional electronic objects on the surface of the screen substrate during the fixing step. Thus, it is possible to distribute the functional electronic objects on a reception face of a screen substrate regardless of the way in which said electronic objects have been brought by the supplying unit to the level of the positioning mask during the supplying step, and to be able to hold the positioning of said functional electronic objects during the installation step directly via the positioning mask.

Some preferred but non-limiting aspects are as follows.

According to an embodiment, the functional electronic objects are arranged on the reception face of the positioning mask in a disorderly free organization during the supplying step.

According to an embodiment, the fixing phase comprises a distribution step in which a functional electronic object from among said assembly is positioned in each of the conduits delimited by the body of the positioning mask.

According to an embodiment, the distribution step may comprise a step of applying a magnetic field. In this case, a functional electronic object of the assembly may comprise a magnetically sensitive portion configured to allow the positioning of the functional electronic object when the magnetically sensitive portion is subjected to the magnetic field.

According to an embodiment, the distribution step may comprise a step of applying an electric field. In this case, a functional electronic object of the assembly may comprise an electrically sensitive portion configured to allow the positioning of the functional electronic object when the electrically sensitive portion is subjected to the electric field.

According to an embodiment, the fixing phase is implemented in a liquid medium.

According to an embodiment, the distribution step can be carried out in an agitation fluid configured to define an agitation environment, said agitation environment being configured to promote the positioning of a functional electronic object in at least one of the conduits delimited by the body of the positioning mask.

According to an embodiment, the distribution step may comprise a step of vibrating the positioning body, for example by means of a vibration device. For example, the distribution step can be carried out in a liquid intended to contain a functional electronic object, said liquid being in contact with an ultrasonic vibration device. In this case, the distribution step may comprise a step of vibrating the liquid by the ultrasonic vibration device so as to position a functional electronic object in at least one of the conduits delimited by the body of the positioning mask.

According to an embodiment, the distribution step can comprise a step of applying a flow fluid configured to allow a flow allowing the positioning of a functional electronic object in at least one of the conduits delimited by the body of the positioning mask. For example, the functional electronic object may comprise a dense layer made of a material having a density greater than the other materials constituting the functional electronic object, said dense layer being positioned on a surface of the functional electronic object intended to be placed in contact with the screen support. For example, the dense layer can be made of iron or gold. In this case, the flowing fluid can comprise water and the flow of the functional electronic object can be achieved by the action of gravity.

According to an embodiment, the fixing phase comprises a securing step implemented before the installation step, in which at least a part of the functional electronic object is secured with at least a part of the body of the positioning mask at the first opening, then a disengaging step in which the functional electronic object is disengaged from said at least part of the body of the positioning mask.

According to an embodiment, the functional electronic object is provided with an affinity element configured to be secured to said at least part of the body of the positioning mask at the first opening.

According to an embodiment, the affinity element comprises a surface having undergone a hydrophilic or hydrophobic surface treatment configured to interact with the body of the positioning mask having respectively undergone a hydrophilic or hydrophobic surface treatment at the level of the first opening.

According to an embodiment, the securing step comprises a lowering of the temperature of the liquid medium to a temperature below the solidification temperature of the liquid medium at the level of the cooperation surface so as to solidify the liquid medium so as to join together the functional electronic object at the level of the cooperation surface, and in which the disengaging step comprises a rise of the temperature of the liquid medium to a temperature strictly above the solidification temperature of the liquid medium.

According to an embodiment, the liquid medium comprises water, the temperature lowering can therefore be carried out at a temperature below 0° C. at the level of the cooperation surface so as to solidify the water at the level of the cooperation surface, and the temperature rise is carried out at a temperature above 0° C.

According to an embodiment, the fixing phase comprises a removal step, successive to the placing step, in which the contact between the positioning mask and the screen substrate is eliminated.

Advantageously, the removal step makes it possible to reuse the positioning mask.

According to an embodiment, the fixing phase comprises a step of fixing the functional electronic objects on the reception face of the screen substrate, in which a fixing agent secures the functional electronic objects to the screen substrate.

According to an embodiment, the holding agent comprises a soldering agent disposed so as to seal the conduit at the level of the cooperation surface. For example, the soldering agent can comprise silver tin, or indium. In this case, the holding agent can possibly also act as a fixing agent by securing the functional electronic objects to the screen substrate.

BRIEF DESCRIPTION OF THE DRAWINGS

Other aspects, aims, advantages and characteristics of the disclosure will become more apparent on reading the following detailed description of preferred embodiments thereof, given by way of non-limiting example, and made with reference to the accompanying drawings on which:

FIG. 1 is a perspective view of a system for manufacturing an optoelectronic device according to a particular embodiment of the disclosure.

FIG. 2 is a sectional view of a system for manufacturing an optoelectronic device having the supplying unit and the distribution unit, according to a particular embodiment of the disclosure.

FIG. 3 is a sectional view of a system for manufacturing an optoelectronic device according to a particular embodiment of the disclosure comprising a vibration device.

FIG. 4 is a sectional view of a system for manufacturing an optoelectronic device according to a particular embodiment of the disclosure comprising a device for generating a magnetic field.

FIG. 5 is a sectional view of a system for manufacturing an optoelectronic device according to a particular embodiment of the disclosure comprising a holding agent disposed at the first opening.

FIG. 6 is a sectional view of a system for manufacturing an optoelectronic device according to a particular embodiment of the disclosure comprising a cooling plate.

FIG. 7 is a schematic view of a method for manufacturing an optoelectronic device according to an embodiment of the disclosure.

DETAILED DESCRIPTION OF THE DRAWINGS

In FIGS. 1 to 7 and in the remainder of the description, the same references represent identical or similar elements. In addition, the various elements are not represented to scale so as to favor the clarity of the figures. Furthermore, the different embodiments and variants are not mutually exclusive and can be combined with one another.

As illustrated in FIG. 1, the disclosure concerns a positioning mask 20, and a system for manufacturing an optoelectronic device 1 comprising a plurality of unitary semiconductor functional electronic objects 3. These functional electronic objects 3 are intended to be fixed to a reception face 12 of a light emission screen substrate 10 by being distributed over all or part of the free surface of the reception face 12. According to an embodiment, each functional electronic object 3 comprises a light-emitting element comprising at least one light-emitting diode capable of emitting and/or picking up light, and optionally an electronic control component associated with said at least one light-emitting diode, such as for example a transistor.

According to a non-limiting variant, the functional electronic objects 3 can have dimensions comprised between 1 µm and 1 mm. Furthermore, the distance between two functional electronic objects 3 on the reception face 12 of the screen substrate 10 is comprised between 1 µm and 2 mm.

As will be detailed later, the disclosure also concerns a method for manufacturing such an optoelectronic device 1.

The system for manufacturing an optoelectronic device 1 comprises the positioning mask 20 comprising a body delimiting a cooperation face 21 intended to face the reception face 12 of the screen substrate 10, and a reception face 23 opposite to the cooperation face 21.

According to a non-limiting variant, the body has a substantially parallelepipedal shape, the reception surface 23 and the cooperation surface 21 forming two parallel faces of the body. Advantageously, the body may have a rectangular parallelepiped shape in order to be able to be adapted to the rectangular shape of a screen or part of a screen. Alternatively, the body may have a cylindrical shape to be able to be adapted to the shape of a build plate generally used in microelectronic methods.

According to an embodiment, the body is made of a polymer material, and in particular the positioning mask 20 can be obtained by a method suitable for polymer materials such as plastic embossing or 3D printing. In this way, the method for making the positioning mask can be adapted to the industrial scale, and represents a low cost.

Alternatively, the body can be made of a metallic material.

The body of the positioning mask 20 delimits a plurality of conduits 25 distributed over the surface of the body where each conduit 25 is dimensioned to accommodate a single functional electronic object 3. The non-limiting embodiment represented in FIG. 1 has four conduits 25 distributed on the surface of the body. Each conduit 25 passes through the material constituting the body and opens out on the side of the cooperation face 21 through a first opening 27 and opens out on the side of the reception face 23 through a second opening 29. The first opening 27 is shaped so that its section is strictly smaller than the section of the second opening 29. For example the conduit 25 may be infundibuliform, the first opening 27 forming the narrow opening of the funnel and the second opening 29 forming the wide opening of the funnel.

In this way, the positioning mask 20 with one or more funnel-shaped conduits 25 allows faster positioning, and therefore release, of the functional electronic objects 3 facing the funnels. These arrangements therefore make it possible to obtain precise positioning at the level of the reception face 12 of the screen substrate 10. In fact, an infundibuliform conduit 25 makes it easier to accommodate a functional electronic object 3.

According to a non-represented embodiment, the conduit 25 may have a frustoconical shape, the first opening 27 and the second opening 29 constituting the end bases of the truncated cone. For example, the diameter of the second opening 29 may be less than or substantially equal to the distance separating two functional electronic objects 3 when they are positioned on the screen substrate 10.

The system for manufacturing an optoelectronic device 1 comprises a supplying unit 30 for freely depositing an assembly of functional electronic objects 3 on the reception face 23 of the positioning mask 20. For example, the functional electronic objects 3 can present a disorderly free organization. Advantageously, the fact of freely depositing the functional electronic objects 3 on the reception face 23 of the positioning mask 20 makes it possible to distribute the functional electronic objects 3 on a reception face 12 of a screen substrate 10 without constraining beforehand their positioning vis-à-vis the orifices formed in the positioning mask 20.

In addition, the system for manufacturing an optoelectronic device 1 can comprise a distribution unit 40 allowing to position a functional electronic object 3 among said assembly in each of the conduits 25 delimited by the body of the positioning mask 20.

FIG. 2 illustrates an embodiment in which the supplying unit 30 comprises handling equipment intended to be disposed above the reception face 23 of the positioning mask 20. For example, the handling equipment can comprise a handle on which the functional electronic objects 3 are attached. Thus, when said handle is disposed above the positioning mask 20, it is possible to separate one or more of the functional electronic objects 3 arranged opposite a conduit 25, for example by means of a laser pulse. In this case, the supplying unit 30 acts as the distribution unit 40.

The arrangements described above make it possible to separate only certain functional electronic objects 3 from the supplying unit 30 in the conduits 25 of the positioning mask 20. Synergistically, the distribution unit 40 thus makes it possible to reduce the need for concordance between the mesh of the screen substrate 10 and the mesh of the supply unit 30, or to damp any dimensional clearances.

According to an embodiment, the distribution unit 40 may comprise a unit for applying a flow fluid configured to generate a flow capable of positioning a functional electronic object 3 in at least one of the conduits 25 delimited by the body of the positioning mask 20.

Advantageously, each functional electronic object 3 can comprise a proximal end 32 intended to be turned towards the side of the reception face 12 of the screen substrate 10 and an opposite distal end 34 and in which the system comprises an orientation unit 60 of the functional electronic objects 3 relative to the body of the positioning mask 20 in such a way that any functional electronic object 3 emerging from the body through the first opening 27 is oriented so that its proximal end 32 is facing the reception face 12 of the screen substrate 10.

In other words, the orientation unit 60 is intended to allow the orientation of a functional electronic object 3 in the conduit 25 with respect to its proximal 32 and distal 34 ends.

FIG. 3 illustrates an embodiment in which the distribution unit 40 comprises an agitation fluid 42 configured to define an agitation environment configured to promote the positioning of a functional electronic object 3 in at least one of the conduits 25 delimited by the body of the positioning mask 20.

For example, each functional electronic object 3 can have a height H1 considered in a transverse direction oriented transversely to the reception face 12 of the light emission screen substrate 10. The height H1 may be greater than the dimensions of the functional electronic object 3 in a plane perpendicular to the transverse direction and the dimensions of the section S1 of the first opening 27 of the conduits 25 may be less than the value of the height H1.

Thus, the arrangements described above make it possible to prevent the passage of the functional electronic object 3 through the first opening 27 in a configuration where its height H1 would be across the first opening 27.

Advantageously, the distribution unit 40 can comprise a vibration device 31 configured to vibrate the body of the positioning mask 20. In this case, the distribution unit 40 can comprise a unit for applying a liquid intended to contain the functional electronic object 3. The liquid being in contact with an ultrasonic vibration device 31 can thus vibrate and can make it possible to position the functional electronic object 3 in at least one of the conduits 25 delimited by the body of the positioning mask 20.

Alternatively or jointly, the orientation unit 60 may comprise a fluid application unit, said fluid possibly being the agitation fluid 42, in which the functional electronic objects 3 are oriented by preferential gravity. In this case, each functional electronic object 3 can be provided with a dense portion 37 having sufficient density to make the functional electronic object 3 sensitive to gravity preferentially at the dense portion 37.

FIG. 4 illustrates an embodiment in which the orientation unit 60 comprises a unit for applying a magnetic field, such as for example a device for generating a magnetic field 39 provided with coils 41. In this case, each functional electronic object 3 can comprise a magnetically sensitive portion 33 configured to allow the orientation of the functional electronic object 3 when the magnetically sensitive portion 33 is subjected to the magnetic field.

According to an embodiment, the distribution unit 40 may comprise a unit for applying a magnetic field, such as for example a device for generating a magnetic field 39 provided with coils 41. In this case, a functional electronic object 3 of the assembly may comprise a magnetically sensitive portion 33 configured to allow the positioning of the functional electronic object 3 when the magnetically sensitive portion 33 is subjected to the magnetic field.

It is therefore possible that the magnetic field generated by the magnetic field generating device 39 is applied to orient the functional electronic object 3 only, or to position the functional object 3 at the level of the first opening 27 only, or to achieve both the orientation of the functional electronic object 3 and its positioning.

According to a non-represented embodiment, the distribution unit 40 may comprise a unit for applying an electric field. In this case, a functional electronic object 3 of the assembly may comprise an electrically sensitive portion configured to allow the positioning of the functional electronic object 3 when the electrically sensitive portion is subjected to the electric field.

With reference to FIGS. 5 and 6, the body of the positioning mask 20 may comprise a holding agent 35 disposed at the level of the first opening 27. The holding agent 35 can in particular be configured to hold the functional electronic object 3 in a first configuration in which the functional electronic object 3 is secured to the body of the positioning mask 20 at the level of the cooperation surface 21.

In the variant shown in FIG. 5, the holding agent 35 comprises a soldering agent arranged so as to temporarily close the first opening 27 of the conduit 25 at the level of the cooperation surface 21. For example, the soldering agent may comprise tin silver or indium.

In the variation illustrated in FIG. 6, the holding agent 35 is configured to be in a solid state at a target temperature, and in which the temperature of the body of the positioning mask 20 at the first opening 27 is less than the target temperature when the functional electronic object 3 is in the first configuration. For example, the holding agent 35 comprises water, and the target temperature corresponds to the solidification temperature of the water, for example 0° C. In this case, the system for manufacturing an optoelectronic device 1 may comprise a cooling plate 43, configured to lower the temperature to the level of the target temperature, so as to solidify the water at the level of the first opening 27, and thus form the holding agent 35.

Finally, the system for manufacturing an optoelectronic device 1 comprises a positioning unit 50 for positioning the cooperation face 21 of the positioning mask 20 facing the reception face 12 of the screen substrate 10, in a relative position such that the functional electronic objects 3 positioned in the conduits 25 delimited by the body of the positioning mask 20 are in contact with the reception face 12 of the screen substrate 10.

According to an embodiment, the placing unit 50 comprises alignment elements, such as, for example, alignment crosses associated with optical devices or lasers, configured to allow the body to be aligned facing the reception face 12 of the screen substrate 10. The conduits 25 delimited by the body of the positioning mask 20 can then be arranged at predetermined locations corresponding to the locations of the reception face 12 of the screen substrate 10 where the functional electronic objects 3 of the optoelectronic device are positioned. For example, the predetermined locations may correspond to a square mesh of the reception face 12 of the screen substrate 10 having a mesh length substantially equal to 100 μm.

As indicated above, the disclosure also concerns a method for manufacturing an optoelectronic device. FIG. 7 illustrates an embodiment of said method.

The method for manufacturing an optoelectronic device comprises a phase of fixing a plurality of unitary semiconductor functional electronic objects 3 on a reception face 12 of a light emission screen substrate 10 of the optoelectronic device, at the end of which the functional electronic objects 3 are distributed over all or part of the free surface of the reception face 12.

The fixing phase firstly comprises a step E1 of supplying a positioning mask 20 comprising a body delimiting a cooperation face 21 intended to face the reception face 12 of the screen substrate 10, and a reception face 23 opposite to the cooperation face 21, the body delimiting a plurality of conduits 25 distributed over the surface of the body where each conduit 25 is dimensioned to accommodate a single functional electronic object 3 and passes through the material constituting the body and opens out on the side of the cooperation face 21 through a first opening 27 and opens out on the side of the reception face 23 through a second opening 29, the section S1 of the first opening 27 being strictly smaller than the section S1 of the second opening 29.

Then, during a supplying step E2, an assembly of functional electronic objects 3 are freely deposited on the reception face 23 of the positioning mask 20. For example, the supplying step E2 can be implemented so that the functional electronic objects 3 are arranged on the reception face 23 of the positioning mask 20 according to a disorderly free organization. Thus, the distribution of functional electronic objects 3 on a reception face 12 of a screen substrate 10 can be implemented without first constraining their positioning vis-à-vis the orifices made in the positioning mask 20.

A functional electronic object 3 from said assembly can then be positioned in each of the conduits 25 delimited by the body of the positioning mask 20 during a distribution step E3.

According to an embodiment, the supplying unit 30 may comprise a handle on which the functional electronic objects 3 are attached. Thus, when said handle is disposed above the positioning mask 20, the supplying step E2 can be carried out by separating one or more of the functional electronic objects 3 disposed opposite a conduit 25, for example via a laser pulse.

According to an embodiment, the distribution step E3 may comprise a step of applying a magnetic field. In this case, a functional electronic object 3 of the assembly may comprise a magnetically sensitive portion 33 configured to allow the positioning of the functional electronic object 3 when the magnetically sensitive portion 33 is subjected to the magnetic field.

According to an embodiment, the distribution step E3 may comprise a step of applying an electric field. In this case, a functional electronic object 3 of the assembly may comprise an electrically sensitive portion configured to allow the positioning of the functional electronic object 3 when the electrically sensitive portion is subjected to the electric field.

According to a particular variant, the fixing phase can be implemented in a liquid medium.

In this case, the distribution step E3 can be carried out in an agitation fluid 42 configured to define an agitation environment configured to promote the positioning of a functional electronic object 3 in at least one of the conduits 25 delimited by the body of the positioning mask 20.

According to an embodiment, the distribution step E3 may comprise a step of vibrating the positioning body, for example by means of a vibration device 31, for example an ultrasonic vibration device 31. Thus, when the distribution step is carried out in a liquid containing the functional electronic object 3, the vibration of the liquid by the ultrasonic vibration device 31 can make it possible to position said functional electronic object 3 in at least one of the conduits 25 delimited by the body of the positioning mask 20.

According to an embodiment, the distribution step E3 may comprise a step of applying a flow fluid configured to allow the positioning of a functional electronic object 3 by flow in at least one of the conduits 25 delimited by the body of the positioning mask 20. For example, the functional electronic object 3 may comprise a dense layer made of a material having a density greater than the other materials constituting the functional electronic object 3, such as iron or gold, said dense layer being positioned on a surface of the functional electronic object 3 intended to be placed in contact with the screen support. In this case, the flow fluid can comprise water, and the flow of the functional electronic object 3 can be achieved by the action of gravity.

The fixing phase can then comprise a securing step E4 in which at least part of the functional electronic object 3 is secured with at least part of the body of the positioning mask 20 at the level of the first opening 27. For example, the functional electronic object 3 can be provided with an affinity element configured to be secured to said at least part of the body of the positioning mask 20 at the level of the first opening 27.

According to a first non-limiting variant, the affinity element comprises a surface having undergone a hydrophilic or hydrophobic surface treatment, said surface being configured to interact with the body of the positioning mask 20 having respectively undergone a hydrophilic or hydrophobic surface treatment at the level of the first opening 27.

According to another variant, the securing step E4 can comprise a temperature lowering of the liquid medium to a temperature below the solidification temperature of the liquid medium at the level of the cooperation surface 21 so as to solidify the liquid medium to secure the functional electronic object 3 at the level of the cooperation surface 21. For example, the liquid medium can be constituted by water, the lowering of the temperature can therefore be carried out at a temperature below 0° C. at the level of the cooperation surface 21 so as to solidify the water at the level of the cooperation surface 21.

The fixing phase then comprises a positioning step E5 in which the cooperation face 21 of the positioning mask 20 is positioned facing the reception face 12 of the screen substrate 10, in a relative position such that the functional electronic objects 3 positioned in the conduits 25 delimited by the body of the positioning mask 20 are in contact with the reception face 12 of the screen substrate 10, the conduits 25 delimited by the body of the positioning mask 20 being arranged at predetermined locations corresponding to the locations of the reception face 12 of the screen substrate 10 where the functional electronic objects 3 of the optoelectronic device are positioned.

The fixing phase can then comprise a separation step E6 in which the functional electronic object 3 is disengaged from said at least part of the body of the positioning mask 20.

According to the variant in which the securing step E4 comprises a lowering of the temperature of the liquid medium, the disengaging step E6 may comprise a rise of the temperature of the liquid medium to a temperature strictly above the solidification temperature of the liquid medium. For example, if the liquid medium comprises water, the temperature rise can be carried out at a temperature above 0° C.

It is possible that the disengaging step E6 is carried out before or after step E5 of placing the positioning mask 20 against the reception face 12 of the screen substrate 10.

Successively to the placing step E5, the fixing phase may comprise a removal step E7, in which the contact between the positioning mask 20 and the screen substrate 10 is eliminated.

Finally, the fixing phase can comprise a step E8 of fixing the functional electronic objects 3 on the reception face 12 of the screen substrate 10, in which a fixing agent 45 secures the functional electronic objects 3 to the screen substrate 10.

According to an embodiment, the holding agent 35 comprises a soldering agent arranged so as to seal the conduit 25 at the level of the cooperation surface 21. For example, the soldering agent may comprise silver tin, or indium. In this case, the holding agent 35 can possibly also act as the fixing agent 45 by securing the functional electronic objects 3 to the screen substrate.

The invention claimed is:

1. A method for manufacturing an optoelectronic device comprising a fixing phase of fixing a plurality of unitary semiconductor functional electronic objects on a first reception face of a light emission screen substrate of the optoelectronic device, wherein the functional electronic objects are distributed over all or part of a surface of the first reception face, the fixing phase including the following steps:
   a step of providing a positioning mask comprising a body delimiting a cooperation face intended to face the first reception face of the screen substrate, and a second reception face opposite to the cooperation face, the body delimiting a plurality of conduits distributed over a surface of the body where each of the conduits is dimensioned to accommodate a single one of the functional electronic objects and passes through material constituting the body and opens out on a first side of the cooperation face through a first opening and opens out on a second side of the second reception face through a second opening, the first opening being smaller than the second opening,
   a supplying step for depositing an assembly of functional electronic objects on the second reception face of the positioning mask, and
   a placing step in which the cooperation face of the positioning mask is positioned opposite the first reception face of the screen substrate, in a relative position such that the functional electronic objects positioned in the conduits delimited by the body of the positioning mask are in contact with the first reception face of the screen substrate, the conduits delimited by the body of the positioning mask being arranged at predetermined locations corresponding to locations of the first reception face of the screen substrate where the functional electronic objects of the optoelectronic device are positioned.

2. The manufacturing method according to claim 1, wherein the functional electronic objects are arranged on the second reception face of the positioning mask according to a disorderly organization during the supplying step.

3. The manufacturing method according to claim 1, wherein the fixing phase comprises a distribution step in which a functional electronic object from said assembly is positioned in each of the conduits delimited by the body of the positioning mask.

4. The manufacturing method according to claim 1, wherein the fixing phase is implemented in a liquid medium.

5. The manufacturing method according to claim 1, wherein the fixing phase comprises a securing step implemented before the placing step, in which at least one part of the functional electronic object is secured to at least part of the body of the positioning mask at the level of the first opening, then a disengaging step in which the functional electronic object is disengaged from said at least part of the body of the positioning mask.

6. The manufacturing method according to claim 5, wherein the functional electronic object is provided with an affinity element configured to be secured to said at least part of the body of the positioning mask at the level of the first opening.

7. The manufacturing method according to claim 4, wherein the securing step comprises lowering of a temperature of the liquid medium to a temperature below the solidification temperature of the liquid medium at a level of a cooperation surface so as to solidify the liquid medium so as to secure the functional electronic object at the level of the cooperation surface, and wherein the disengaging step comprises an rise in the temperature of the liquid medium to a temperature above the solidification temperature of the liquid medium.

8. The manufacturing method according to claim 1, wherein the fixing phase comprises a removing step, successive to the placing step, in which contact between the positioning mask and the screen substrate is eliminated.

9. The manufacturing method according to claim 1, wherein the fixing phase comprises a step of fixing the functional electronic objects on the first reception face of the screen substrate, in which a fixing agent secures the functional electronic objects to the screen substrate.

10. The manufacturing method according to claim 1, wherein the body of the positioning mask is made of a polymer material.

11. The manufacturing method according to claim 1, wherein the body of the positioning mask is obtained by a plastic embossing method.

12. The manufacturing method according to claim 1, wherein dimensions of a section of the first opening are comprised between 1.1 µm and 1.1 mm.

13. The manufacturing method according to claim 1, wherein a distance between two first openings is comprised between 1 µm and 2 mm.

14. The manufacturing method according to claim 1, wherein each of the functional electronic objects has a height considered in a transverse direction oriented transversely to the first reception face of the screen substrate, said height being greater than dimensions of said functional electronic object in a plane perpendicular to the transverse direction and in which dimensions of the section of the first opening of the conduits are less than the value of said height.

15. The manufacturing method according to claim 7, wherein the body comprises a holding agent disposed at the first opening, said holding agent being configured to hold the functional electronic object in a first configuration in which the functional electronic object is secured to the body of the positioning mask at the level of the cooperation surface.

16. The manufacturing method according to claim 15, wherein the holding agent is configured to be in a solid state at a target temperature, and wherein a body temperature of the positioning mask at the first opening is lower than the target temperature when the functional electronic object is in the first configuration.

17. The manufacturing method according to claim 15, wherein the holding agent comprises a soldering agent arranged so as to temporarily close the first opening of the conduit at the level of the cooperation surface.

18. The manufacturing method according to claim 1, wherein each of the functional electronic objects comprises a proximal end intended to be turned towards the first reception face of the screen substrate and an opposite distal end and in which a system comprises a unit for orienting the functional electronic objects relative to the body of the positioning mask in such a way that any one of the functional electronic objects emerging from the body through the first opening is oriented so that a proximal end of one of the functional electronic objects is facing the first reception face of the screen substrate.

* * * * *